(12) United States Patent
Jia (10) Patent No.: US 11,315,446 B2
(45) Date of Patent: Apr. 26, 2022

(54) DISPLAY PANEL, DISPLAY DEVICE AND METHOD FOR MANUFACTURING THE DISPLAY PANEL

(71) Applicant: Kunshan Go-Visionox Opto-Electronics Co., Ltd., Kunshan (CN)

(72) Inventor: Zhishuai Jia, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 203 days.

(21) Appl. No.: 16/739,139

(22) Filed: Jan. 10, 2020

(65) Prior Publication Data

US 2020/0152096 A1 May 14, 2020

Related U.S. Application Data

(63) Continuation of application No. PCT/CN2019/082085, filed on Apr. 10, 2019.

(30) Foreign Application Priority Data

Jul. 18, 2018 (CN) .......................... 201810792124.6

(51) Int. Cl.
*G09F 9/30* (2006.01)
*H01L 51/52* (2006.01)

(52) U.S. Cl.
CPC .......... *G09F 9/301* (2013.01); *H01L 51/5253* (2013.01); *H01L 2251/5338* (2013.01); *H01L 2251/566* (2013.01)

(58) Field of Classification Search
CPC ....................................................... G09F 9/301
See application file for complete search history.

(56) References Cited

U.S. PATENT DOCUMENTS

| 9,809,012 | B2 | 11/2017 | Xie |
| 10,212,811 | B1 | 2/2019 | Zhang et al. |
| 2018/0166652 | A1 | 6/2018 | Kim et al. |

FOREIGN PATENT DOCUMENTS

| CN | 106652802 A | 5/2017 |
| CN | 107611161 A | 1/2018 |
| CN | 108898954 A | 11/2018 |

*Primary Examiner* — Vip Patel
(74) *Attorney, Agent, or Firm* — Kilpatrick Townsend & Stockton (57) ABSTRACT

The present disclosure provides a display panel, a display device and a method for manufacturing a display panel. The display panel includes a flexible display and a support film. The flexible display includes a display area, a folding area and an extension area. Two ends of the folding area are respectively connected to the display area and the extension area. The display area and the extension area are non-coplanar. The support film is attached to an opposite surface of a display surface of the flexible display. The support film includes a first cured area and a second cured area. The first cured area and the second cured area respectively correspond to the display area and the extension area.

19 Claims, 5 Drawing Sheets

DISPLAY PANEL, DISPLAY DEVICE AND METHOD FOR MANUFACTURING THE DISPLAY PANEL

CROSS-REFERENCES TO RELATED APPLICATIONS

This application is a continuation application for International Application PCT/CN2019/082085, titled "DISPLAY PANEL, DISPLAY DEVICE AND METHOD FOR MANUFACTURING THE DISPLAY PANEL", filed on Apr. 10, 2019, which claims the priority benefit of Chinese Patent Application No. 201810792124.6, titled "DISPLAY PANEL AND METHOD FOR MANUFACTURING THE SAME" and filed on Jul. 18, 2018. The entireties of both applications are incorporated by reference herein for all purposes.

TECHNICAL FIELD

The present disclosure relates to the display field, more particularly to a display panel.

BACKGROUND

Flexible displays generally have the problem of displaying poorly caused by folding. The stress generated by the folded flexible display affects the structure reliability of a display module. To protect the flexible display, it is usually required to attach a supporting layer on a surface of the flexible display.

SUMMARY

The present disclosure provides a display panel, a display device and a method for manufacturing the display panel, which are capable of improving the stability of the display panel.

The present disclosure provides a display panel, including:

a flexible display having a display surface, the flexible display including a display area, an extension area, and a folding area, two ends of the folding area being respectively connected to the display area and the extension area, the display area and the extension area being non-coplanar; and a support film, attached to an opposite surface of the display surface of the flexible display, the support film including a first cured area and a second cured area, the first cured area corresponding to the display area, and the second cured area corresponding to the extension area.

In some embodiments, a curing strength of the first cured area is greater than a curing strength of the second cured area.

In some embodiments, the support film further includes a bending area arranged between the first cured area and the second cured area, and the bending area corresponds to the folding area.

In some embodiments, a curing strength of the bending area is less than a curing strength of the first cured area and a curing strength of the second cured area.

In some embodiments, a plurality of grooves are spaced apart and arranged at a side of the bending area, which is away from the folding area.

In some embodiments, a portion of the groove proximate to the folding area is a bottom, and an area of the bottom of the groove is less than an opening area of the groove.

In some embodiments, a thickness of the support area in the first cured area and a thickness of the support area in the second cured area are both greater than a thickness of the support film in the bending area.

In some embodiments, a surface of the bending area, which is away from the folding area, is provided with a reflective coating.

In some embodiments, the bending area includes a plurality of cured areas and a plurality of non-cured areas.

In some embodiments, the cured area and the non-cured area are stripe-shaped, and the cured area and the non-cured area are arranged alternately.

In some embodiments, extending directions of the stripe-shaped cured area and non-cured area are consistent with a bending direction of the folding area.

In some embodiments, an outside edge of the cured area and an outside edge of the non-cured area are in zigzag shapes and engage with each other.

In some embodiments, the support film is made of polyethylene terephthalate film or polyimide film.

The present disclosure further provides a display device including the above described display panel.

The present disclosure further provides a method for manufacturing a display panel, including:

providing a flexible display having a display surface, the flexible display including a display area, an extension area, and a folding area, wherein two ends of the folding area are respectively connected to the display area and the extension area;

attaching a support film to an opposite surface of the display surface of the flexible display;

dividing the support film into a first cured area, a second cured area, and a bending area, wherein the bending area is disposed between the first cured area and the second cured area; the first cured area corresponds to the display area; the second cured area corresponds to the extension area; and the bending area corresponds to the folding area;

arranging a shading plate between the support film and a radiation source, wherein the shading plate is arranged parallel to and opposite to the bending area;

curing the first cured area and the second cured area of the support film via the radiation source; and bending the flexible display towards the opposite side of the display surface of the flexible display, and curing the bending area of the support film.

In some embodiments, the shading plate has a hollowed pattern.

In some embodiments, a radiating time of the radiation source for the first cured area is greater than a radiating time for the second cured area.

In some embodiments, after dividing the support film into the first cured area, the second cured area and the bending area, the method further includes:

coating a surface of the bending area, which is away from the folding area, with a reflective coating.

In some embodiments, the reflective coating is a reflective varnish coating.

In some embodiments, the radiation source is a combination of one or more of an ultraviolet lamp, an LED lamp, a mercury lamp.

The display panel provided by the present disclosure can enhance the supporting strength of the support film supporting the display area and the extension area by curing the first cured area and the second cured area. Meanwhile, in the folding area, the bending stresses generated by the flexible display and the support film can be reduced, therefore, the stability of the display panel can be improved.

DETAILED DESCRIPTION OF THE INVENTION

There are various challenges with flexible displays. When bended, the flexible display and the supporting layer generate relative large bending stresses at the bended area, which causes damages on the flexible display easily. In order to make the objectives, technical solutions and advantages of the present disclosure clearer and more comprehensible, the display panel of the present disclosure and the method for manufacturing the display panel are further described in detail below with reference to the accompanying drawings. It should be understood that the detailed embodiments described herein are merely used to explain the present disclosure, but not intended to limit the same.

Figure 1:
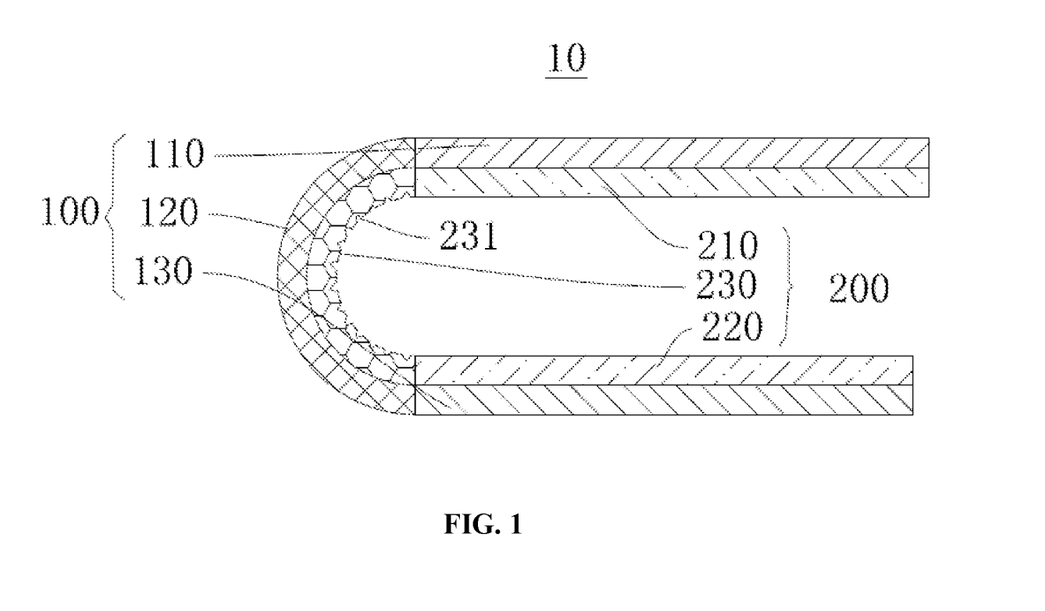
FIG. 1 is a schematic diagram of a display panel according to an embodiment of the present disclosure.
Figure 2:
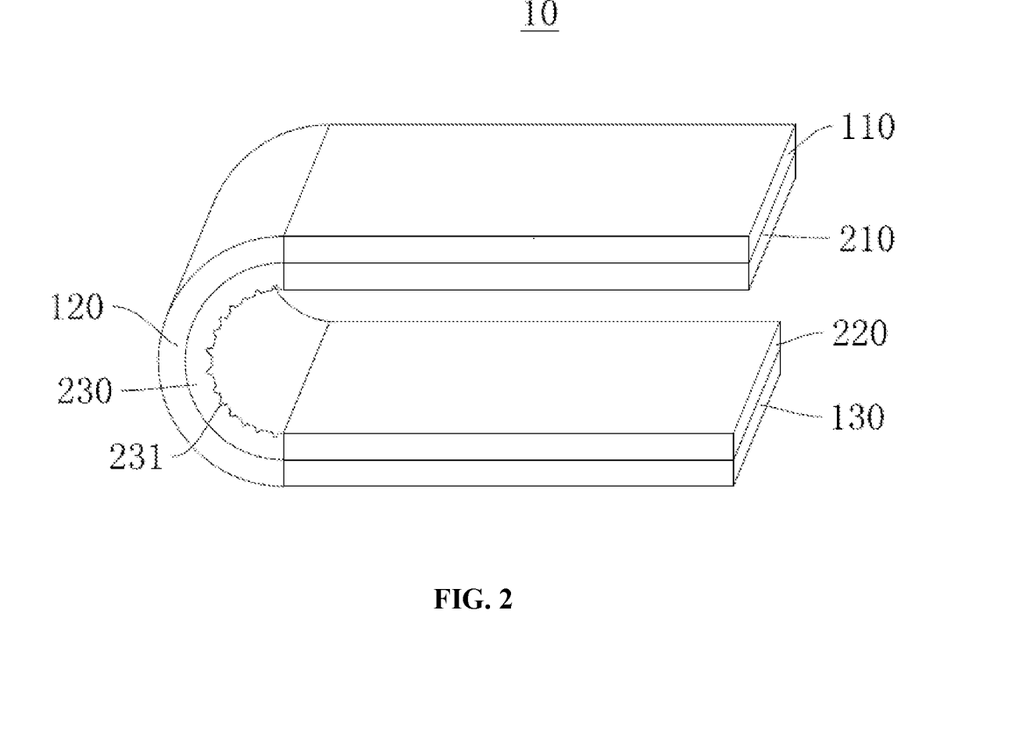
FIG. 2 is a perspective diagram of the display panel according to an embodiment of the present disclosure.
Figure 3:
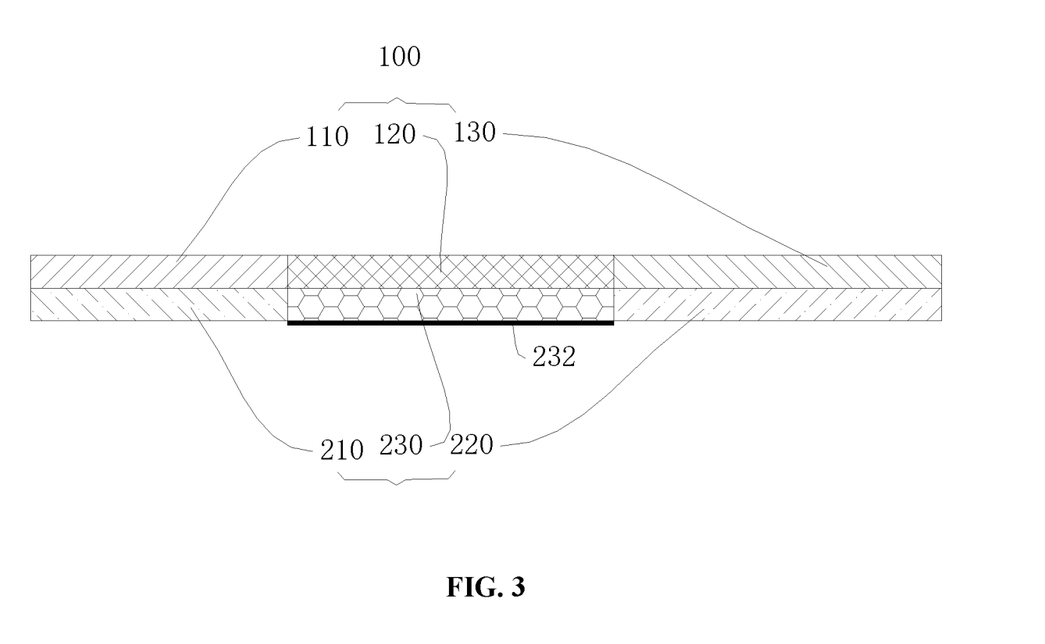
FIG. 3 is a schematic diagram of an unfolded display panel according to an embodiment of the present disclosure.

Referring to FIG. 1 to FIG. 3, an embodiment of the present disclosure provides a display panel 10. The display panel 10 includes a flexible display 100 and a support film 200. The flexible display 100 has a display area 110, a folding area 120 and an extension area 130. Two ends of the folding area 120 are respectively connected to the display area 110 and the extension area 130. The display area 110 and the extension area 130 are non-coplanar. The display area 110 and the extension area 130 are parallel to each other. A support film 200 is attached to an opposite surface of a display surface of the flexible display 100. The support film 200 includes a first cured area 210 and a second cured area 220. The first cured area 210 and the second cured area 220 respectively correspond to the display area 110 and the extension area 130. That is, the first cured area 210 is attached to the display area 110, and the second cured area 220 is attached to the extension area 130.

The flexible display 100 includes a flexible substrate. The flexible substrate can be provided with structures such as a display driving circuit, a light-emitting diode array, and the like. The flexible display 100 is an OLED display. The flexible display 100 can be folded in a certain direction, or can also be folded in a plurality of directions simultaneously. The display area 110 is configured to display an image. An outside edge of the display area 110 is provided with a frame. The frame can serve as a non-active area. When the display panel 10 is required to display a full-screen, a width of the frame may be reduced, or no frame is arranged.

The folding area 120 can be configured to fold the flexible display 100. The folding area 120 can have no specific boundary. The size and bending diameter of the folding area 120 can be flexibly changed. The flexibility of the material of the folding area 120 is better than the flexibility of the material of the display area 110 and the extension area 130. The extension area 130 can be configured to arrange circuit devices. The flexible display 100 can include a front surface and a rear surface which are arranged oppositely. The front surface of the flexible display 100 is the display surface of the flexible display, that is, the flexible display 100 can display the image. The rear surface of the flexible display 100 can be provided with a structure to support the flexible display 100. The bended flexible display 100 can form a U-shaped structure. The inside of the U-shaped structure can be the rear surface of the flexible display 100. The parallel arrangement that the extension area 130 and the display area 110 are parallel to each other enables the display panel 10 to have a plate-shaped structure, thereby facilitating the fixing of the flexible display 100.

The support film 200 can be configured to support the flexible display 100. After the flexible display 100 is bended, the flexible display 100 is prone to being damaged due to the bending stresses or accidental external impacts. As the support film 200 supports the flexible display 100, the strength of the flexible display 100 can be enhanced, thereby avoiding causing damages to the flexible display 100.

The support film 200 can be made of a material having a certain strength and flexibility. The support film 200 can be made of polyethylene terephthalate film or polyimide film. The polyethylene terephthalate film or the polyimide film has better strength and flexibility, and is economical and practical.

The display area 110 and the extension area 130 of the flexible display 100 are respectively two planes prone to being impacted by external forces. Therefore, areas of the support film 200 respectively corresponding to the display area 110 and the extension area 130 should have better hardness and strength. The first cured area 210 and the second cured area 220 can be formed in the support film by high-temperature cure or radiation cure. The cured support film 200 can have better strength and hardness.

In the display panel 10 provided in the embodiment of the present disclosure, the first cured area 210 and the second cured area 220 of the support film 200 can enhance the support strength and hardness of the support film 200 supporting the display area 110 and the extension area 130. Meanwhile, in the folding area 120, the bending stresses generated by the flexible display 100 and the support film 200 can be reduced, therefore, the stability of the display panel 10 can be improved.

A curing strength of the first cured area 210 is greater than a curing strength of the second cured area 220. The display area 110 is usually provided with layer structures of relatively fragile material, such as a touch sensing layer, a polarizer, and the like, and the display area 110 is prone to being pressed or impacted by external forces, therefore the display area 110 should have better strength and hardness. The curing strength of the first cured area 210 is greater than the curing strength of the second cured area 220, therefore, the support strength of the support film 200 supporting the display area 110 can be enhanced, and meanwhile the support film 200 in the second cured area 220 can have a certain flexibility to buffer the impacts of external forces.

The support film 200 further includes a bending area 230. The bending area 230 is provided between the first cured area 210 and the second cured area 220. Two ends of the bending area 230 are respectively connected to the first cured area 210 and the second cured area 220. The bending area 230 corresponds to the folding area 120, that is, the bending area 230 is attached to the folding area 120. The curing strength of the bending area 230 is less than the curing strength of the first cured area 210 and the curing strength of the second cured area 220.

Since the bending area 230 is attached to the folding area 120, the bending area 230 is folded simultaneously with the folding area 120. The bended folding area 120 of the flexible display 100 is located at an edge of the display panel 100, and is prone to being collided or damaged. Meanwhile, the bended folding area 120 of the flexible display 100 can generate bending stresses, and has poor resistance to stress. Therefore, by curing the bending area 230 to a certain extent, the strength of the support film 200 in the bending area 230 may be improved. The curing strength of the bending area 230 is less than the curing strength of the first cured area 210 and the curing strength of the second cured area 220, which can ensure that the support film 200 in the bending area 230 has both flexibility and strength, and that the first cured area 210 and the second cured area 220 have higher strength and hardness.

Referring to FIG. 1, a plurality of grooves 231 are spaced apart and provided at a side of the bending area 230, which is away from the folding area 120. Since the bended support film 200 can generate the bending stresses in the bending area 230, deformation stresses in the bending area 230 can be reduced via the grooves 231, further improving the service life of the support film 200.

A portion of the groove 231 proximate to the folding area 120 is a bottom, and an area of the bottom of the folding area 120 is less than an opening of the groove 231. In the bending area 230, the farther away from the folding area 120, the greater the deformation stress generated by the support film 200. The area of the bottom of the groove 231 is less than the opening area of the groove 231, which enables the deformation stresses of the support film 200 in the bending area 230 to be released uniformly.

The groove 231 can be in a shape of a taper. The opening of the taper is located on the surface of the bending area 230, which is away from the folding area 120.

The thickness of the support film 200 in the first cured area 210 and the thickness of the support film 200 in the second cured area 220 are both greater than the thickness of the support film 200 in the bending area 230. The support film 200 in the bending area 230 should have better flexibility, and the flexibility of the support film 200 in the bending area 230 can be improved by reducing the thickness of the bending area 230. The areas of the support film 200 corresponding to the display area 110 and the extension area 130 respectively should have higher strength and hardness. By configuring the support film 200 in the first cured area 210 and in the second cured area 220 to have greater thickness, the strength and hardness of the support film 200 in the first cured area 210 and in the second cured area 220 can be enhanced.

The surface of the bending area 230, which is away from the folding area 120, is provided with a reflective coating 232. The support film 200 can be cured by means of light radiation. Since the support film 200 in the bending area 230 should have the better flexibility, the curing strength of the bending area 230 can be less than the curing strength of the first cured area 210 and the curing strength of the second cured area 220. By providing the reflective coating 232 on the surface of the bending area 230, which is away from the folding area 120, the curing degree of the bending area 230 caused by the light radiation may be weakened, thereby ensuring that the bending area 230 has a certain flexibility. The reflective coating 232 is a reflective varnish coating.

Figure 4:
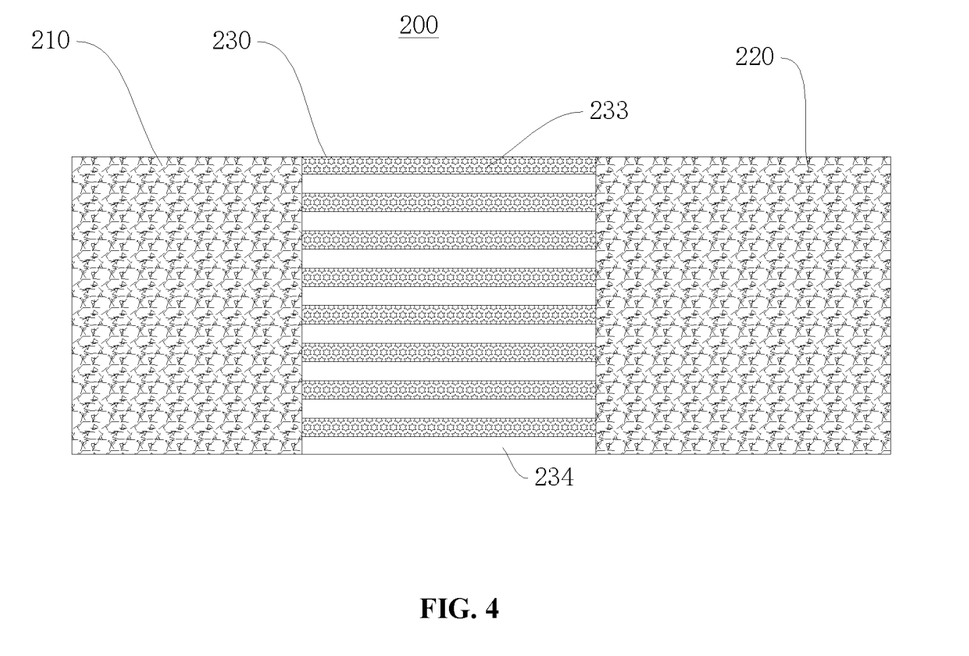
FIG. 4 is a sectional schematic diagram of a support film according to an embodiment of the present disclosure.

Referring to FIG. 4, the bending area 230 includes a plurality of cured areas 233 and a plurality of non-cured areas 234. The cured area 233 and the non-cured area 234 may be arranged alternately. The pattern of the cured area 233 and the pattern of the non-cured area 234 can be designed according to the change of the stresses of the support film 200 in the bending area 230. In the cured area 233, larger deformation stresses are generated by the bended support film 200. A part of the deformation stresses in the cured area 233 can be released via the non-cured area 234. Thus, the service life of the support film 200 can be improved.

The cured area 233 and the non-cured area 234 are stripe-shaped, and the cured area 233 and the non-cured area 234 are arranged alternately. The extending directions of the stripe-shaped cured area 233 and non-cured area 234 can be consistent with the bending direction of the folding area 120. After the support film 200 is bended, in the bending area 230, the deformation stresses generated by the cured areas 233 can be released uniformly to the adjacent non-cured areas 234.

The outside edge of the cured area 233 and the outside edge of the non-cured area 234 are in zigzag shapes and engage with each other. The design of the zigzag shape can increase the contact area between the cured area 233 and the non-cured area 234, facilitating the transfer of the deformation stresses.

Figure 5:
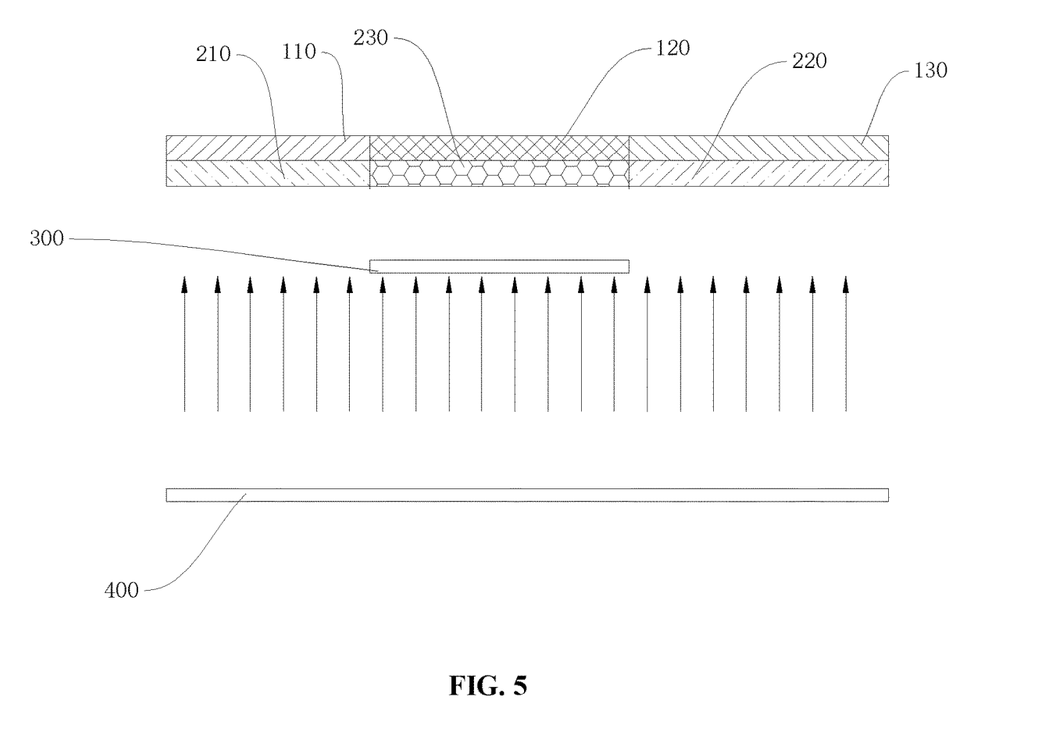
FIG. 5 is a schematic diagram illustrating curing the support film according to an embodiment of the present disclosure.

Referring to FIG. 5, an embodiment of the present disclosure further provides a method for manufacturing a display panel. The method for manufacturing the display panel can be provided to manufacture the display panel 10 provided in the above embodiments. The method for manufacturing the display panel includes the following steps:

S10, providing a flexible display 100 having a display surface; the flexible display 100 including a display area 110, an extension area 130, and a folding area 120; wherein two ends of the folding area 120 are respectively connected to the display area 110 and the extension area 130;

S20, attaching a support film 200 to an opposite surface of a display surface of the flexible display 100;

S30, dividing the support film 200 into a first cured area 210, a second cured area 220, and a bending area 230 disposed between the first cured area 210 and the second cured area 230; the first cured area 210 and the second cured area 220 respectively corresponding to the display area 110 and the extension area 130; and the bending area 230 corresponding to the folding area 120;

S40, arranging a shading plate 300 between the support film 200 and a radiation source 400; the shading plate 300 being arranged parallel to and opposite to the bending area 230;

S50, curing the first cured area 210 and the second cured area 220 of the support film 200 via the radiation source 400;

S60, bending the flexible display 100 towards the opposite surface of the display surface of the flexible display 100, and curing the bending area 230 of the support film 200.

At the step S40, the shading plate 300 can avoid or reduce the curing of the support film 200 in the bending area 230, thereby ensuring that the bending area 230 has a certain flexibility for bending.

The shading plate 300 has a hollowed pattern. Through the hollowed pattern, partial regions in the bending area 230 can be cured, which may improve the strength of the support film 200 in the bending area 230 to some certain extent.

The radiation source 400 uniformly radiates the surface of the support film 200. The radiation strength of the radiation source 400 on the different areas also can vary according to different requirements for the curing extent of the support film 200 in different areas.

At the step S50, the first cured area 210 and the second cured area 220 are cured via the radiation source 400, which can enhance the support strength and hardness of the support film 200 in the display area 110 and in the extension area 130. Meanwhile, the bending of the folding area 120 of the flexible display 100 is not affected. Therefore, the stability of the flexible display 100 may be improved.

At the step S60, after the flexible display 100 is bended, the bending area 230 of the support film 200 is cured, without affecting the bending of the support film 200. When the support film 200 is being bended, excessive deformation stresses will not be generated due to the better flexibility of the bending area 230. The bending area 230 isn't cured until the flexible display 10 is bended, which enhances the strength of the bending area 230 of the support film 200, thereby avoiding fracture and damages of the internal circuits of the flexible display 100, and improving the service lives of the support film 200 and the flexible display 100.

At the step S50, the first cured area 210 and the second cured area 220 are cured by means of radiation. The radiation source 400 can be a combination of one or more of an ultraviolet lamp, an LED lamp and a mercury lamp.

A radiating time of the radiation source for the first cured area 210 is greater than a radiating time for the second cured area 220, therefore the curing degree of the first cured area 210 is greater than the curing degree of the second cured area 220. Since the display area 110 is usually provided with layer structures having a relatively fragile material, such as a touch sensing layer, a polarizer, and the like, and the display area 110 is prone to being pressed or impacted by external forces, therefore, the display area 110 should have better strength and hardness. The curing strength of the first cured area 210 is greater than the curing strength of the second cured area 220, therefore, the support strength of the support film 200 supporting the display area 110 can be enhanced, and meanwhile the support film 200 in the second cured area 220 can have certain flexibility to buffer the impacts of external forces.

The step S30 further includes: coating the surface of the bending area 230, which is away from the folding area 120, with a reflective coating 232.

In this embodiment, by providing the reflective coating 232 on the surface of the bending area 230, which is away from the folding area 120, the curing degree of the bending area 230 caused by the light radiation may be weakened, thereby ensuring that the bending area 230 has a certain flexibility. The reflective coating 232 is a reflective varnish coating.

All technical features in the embodiments can be employed in arbitrary combinations. For purpose of simplifying the description, not all arbitrary combinations of the technical features in the embodiments illustrated above are described. However, as long as such combinations of the technical features are not contradictory, they should be considered as within the scope of the present disclosure.

The above embodiments are merely illustration of several implementations of the disclosure, and the description thereof is more specific and detailed, but should not be regarded as limitations of the scope of the present disclosure. It should be noted that, for those skilled in the art, various modifications and improvements can be made without departing from the conception of the present application, and they are within the scope of the present disclosure. Therefore, the scope of the present disclosure should be defined by the appended claims.

The invention claimed is:

1. A display panel, comprising:
a flexible display comprising a display area, an extension area, and a folding area, a front surface of the display area being configured as a display surface; and
a support film comprising a bending area attached to the folding area of the flexible display, the support film being attached to an opposite surface of the display surface of the flexible display;
wherein:
two ends of the folding area are respectively connected to the display area and the extension area;
the display area and the extension area are non-coplanar;
the support film comprises a first cured area and a second cured area;
the first cured area is attached to the display area;
the second cured area is attached to the extension area;
the bending area is positioned between the first cured area and the second cured area, and the bending area comprises a first side facing away from the folding area and a plurality of grooves positioned on the first side of the bending area;
each of the plurality of grooves comprises an opening that decreases volume in a bent configuration, the opening of each of the plurality of grooves tapers inwardly towards the folding area for stress release.

2. The display panel of claim 1, wherein a hardness of the first cured area is greater than a hardness of the second cured area.

3. The display panel of claim 1, wherein a hardness of the bending area is less than a hardness of the first cured area and a hardness of the second cured area.

4. The display panel of claim 1, wherein the plurality of grooves are arranged at the first side of the bending area at intervals.

5. The display panel of claim 4, wherein a portion of the groove proximate to the folding area is a bottom of the groove, and an area of the bottom of the groove is less than an opening area of the groove.

6. The display panel of claim 1, wherein a thickness of the support film in the first cured area and a thickness of the support film in the second cured area are respectively greater than a thickness of the support film in the bending area.

7. The display panel of claim 1, wherein a surface of the bending area positioned away from the folding area is provided with a reflective coating.

8. The display panel of claim 1, wherein the bending area comprises a plurality of cured areas and a plurality of non-cured areas.

9. The display panel of claim 8, wherein the cured area and the non-cured area are stripe-shaped, and the cured area and the non-cured area are arranged alternately.

10. The display panel of claim 9, wherein the stripe-shaped cured areas and non-cured areas extend along an extending direction consistent with a bending direction of the folding area, and arranged alternately along a width direction of the bending area.

11. The display panel of claim 9, wherein an outside edge of the cured area and an outside edge of the non-cured area are in zigzag shapes and engaged with each other.

12. The display panel of claim 1, wherein the support film is made of polyethylene terephthalate film or polyimide film.

13. A display device, comprising the display panel of claim 1.

14. A method for manufacturing a display panel, comprising:
providing a flexible display, the flexible display comprising a display area, an extension area, and a folding area, two ends of the folding area being respectively connected to the display area and the extension area, a front surface of the display area being configured as a display surface;
attaching a support film to an opposite surface of the display surface of the flexible display;

dividing the support film into a first cured area, a second cured area, and a bending area, the bending area being disposed between the first cured area and the second cured area, the first cured area being attached to the display area, the second cured area being attached to the extension area, the bending area being attached to the folding area;

arranging a shading plate between the support film and a radiation source, the shading plate being arranged parallel to and opposite to the bending area;

curing the first cured area and the second cured area of the support film via the radiation source;

bending the flexible display towards the opposite side of the display surface of the flexible display;

curing the bending area of the support film; and forming a plurality of grooves on a first side of the bending area, the first side of the bending area facing away from the folding area, each of the plurality of grooves comprising an opening that decreases volume in a bent configuration, the opening of each of the plurality of grooves tapering inwardly towards the folding area.

15. The method for manufacturing the display panel of claim 14, wherein the shading plate has a hollowed pattern.

16. The method for manufacturing the display panel of claim 14, wherein a radiating time of the radiation source for the first cured area is greater than a radiating time for the second cured area.

17. The method for manufacturing the display panel of claim 14, wherein after dividing the support film into the first cured area, the second cured area and the bending area, the method further comprises:

coating a surface of the bending area, which is away from the folding area, with a reflective coating.

18. The method for manufacturing the display panel of claim 17, wherein the reflective coating is a reflective varnish coating.

19. The method for manufacturing the display panel of claim 14, wherein the radiation source is a combination of one or more of an ultraviolet lamp, an LED lamp, a mercury lamp.

\* \* \* \* \*